United States Patent

Hause et al.

Patent Number: 5,926,713
Date of Patent: Jul. 20, 1999

[54] METHOD FOR ACHIEVING GLOBAL PLANARIZATION BY FORMING MINIMUM MESAS IN LARGE FIELD AREAS

[75] Inventors: Fred N. Hause; Basab Bandyopadhyay; H. Jim Fulford, Jr.; Robert Dawson, all of Austin; Mark W. Michael, Cedar Park; William S. Brennan, Austin, all of Tex.

[73] Assignee: Advanced Micro Devices, Inc.

[21] Appl. No.: 08/923,322

[22] Filed: Sep. 4, 1997

Related U.S. Application Data

[63] Continuation of application No. 08/633,620, Apr. 17, 1995, abandoned.

[51] Int. Cl.$^6$ ................................................. H01L 21/336
[52] U.S. Cl. ........................ 438/296; 438/424; 438/427; 438/435; 438/692
[58] Field of Search .................. 438/424, 296, 438/427, 435, 437, 692

[56] References Cited

U.S. PATENT DOCUMENTS

| | | | |
|---|---|---|---|
| 4,211,582 | 7/1980 | Horng et al. ........................ | 437/67 |
| 4,274,909 | 6/1981 | Venkataraman et al. . | |
| 4,385,975 | 5/1983 | Chu et al. . | |
| 4,390,393 | 6/1983 | Ghezzo et al. . | |
| 4,445,967 | 5/1984 | Kameyama . | |
| 4,532,701 | 8/1985 | Kameyama et al. . | |
| 4,671,970 | 6/1987 | Keiser et al. . | |
| 4,868,136 | 9/1989 | Ravaglia . | |
| 4,871,685 | 10/1989 | Taka et al. . | |
| 4,873,203 | 10/1989 | Kaga et al. . | |
| 4,906,585 | 3/1990 | Neppl et al. . | |
| 4,952,524 | 8/1990 | Lee et al. ........................ | 437/67 |

(List continued on next page.)

FOREIGN PATENT DOCUMENTS

| | | |
|---|---|---|
| 0300569 | 1/1989 | European Pat. Off. . |
| 0461498 | 12/1991 | European Pat. Off. . |
| 56-140641 | 11/1981 | Japan . |
| 57-91535 | 6/1982 | Japan . |
| 58-42251 | 3/1983 | Japan . |
| 58-220444 | 12/1983 | Japan . |
| 59-87831 | 5/1984 | Japan . |
| 0186342 | 10/1984 | Japan ........................ 437/72 |
| 0015944 | 1/1985 | Japan ........................ 437/67 |
| 60-38831 | 2/1985 | Japan . |

(List continued on next page.)

OTHER PUBLICATIONS

IBM Technical Disclosure Bulletin, "Forming Wide Trench Dielectric Isolation", Apr. 1983, 2 pages.
Written Opinion for PCT/US97/02438 dated Jan. 15, 1998.
International Search Report for PCT/US 97/03255 dated Jul. 4, 1997.
International Search Report for PCT/US 97/02438 dated Jun. 4, 1997.
Wolf; "Silicon Processing for the VLSI Era, vol. 1: Process Technology", Lattice Press; 1986; pp. 407–458.

*Primary Examiner*—Trung Dang
*Attorney, Agent, or Firm*—Kevin L. Daffer; Robert C. Kowert; Conley, Rose & Tayon

[57] ABSTRACT

An isolation technique is provided for improving the overall planarity of trench isolation regions relative to adjacent silicon mesas. The isolation process results in a spaced plurality of silicon risers formed in wide isolation regions. The space between silicon risers are ideally suited for optimal fill of a dielectric deposited across the semiconductor topography, i.e., across and between the silicon risers formed between active areas. The silicon risers, and optimally dimensioned trenches extending between the risers, enhance the planarity of the deposited dielectric. The deposited dielectric upper surface includes recesses of minimal elevational disparity, wherein the recesses are closely spaced in alignment directly above the trenches formed between silicon risers. The recesses can be readily removed by a chemical-mechanical polishing step with minimal deformity to the polishing pad, resulting in global planarization of the dielectric upper surface.

26 Claims, 4 Drawing Sheets

U.S. PATENT DOCUMENTS

| | | |
|---|---|---|
| 4,980,311 | 12/1990 | Namose . |
| 4,994,406 | 2/1991 | Vasquez et al. . |
| 5,004,703 | 4/1991 | Zdebel et al. . |
| 5,011,788 | 4/1991 | Kawaji et al. . |
| 5,096,848 | 3/1992 | Kawamura . |
| 5,175,122 | 12/1992 | Wang et al. . |
| 5,225,358 | 7/1993 | Pasch ........................................ 437/67 |
| 5,229,315 | 7/1993 | Jun et al. . |
| 5,229,316 | 7/1993 | Lee . |
| 5,231,046 | 7/1993 | Tasaka . |
| 5,292,689 | 3/1994 | Cronin et al. ............................ 437/67 |
| 5,294,562 | 3/1994 | Lur et al. . |
| 5,308,784 | 5/1994 | Kim et al. . |
| 5,308,786 | 5/1994 | Lur et al. .................................. 437/67 |
| 5,371,036 | 12/1994 | Lur et al. . |
| 5,372,950 | 12/1994 | Kim et al. . |
| 5,372,968 | 12/1994 | Lur et al. . |
| 5,691,252 | 11/1997 | Pan . |
| 5,696,020 | 12/1997 | Ryum et al. . |

FOREIGN PATENT DOCUMENTS

| | | |
|---|---|---|
| 61-85838 | 5/1986 | Japan . |
| 61-166042 | 7/1986 | Japan . |
| 2-140951 | 5/1990 | Japan . |
| 0272745 | 11/1990 | Japan ...................... 437/67 |
| 0062946 | 3/1991 | Japan ...................... 437/67 |
| 3-96249 | 4/1991 | Japan . |
| 0190663 | 7/1993 | Japan ...................... 437/67 |

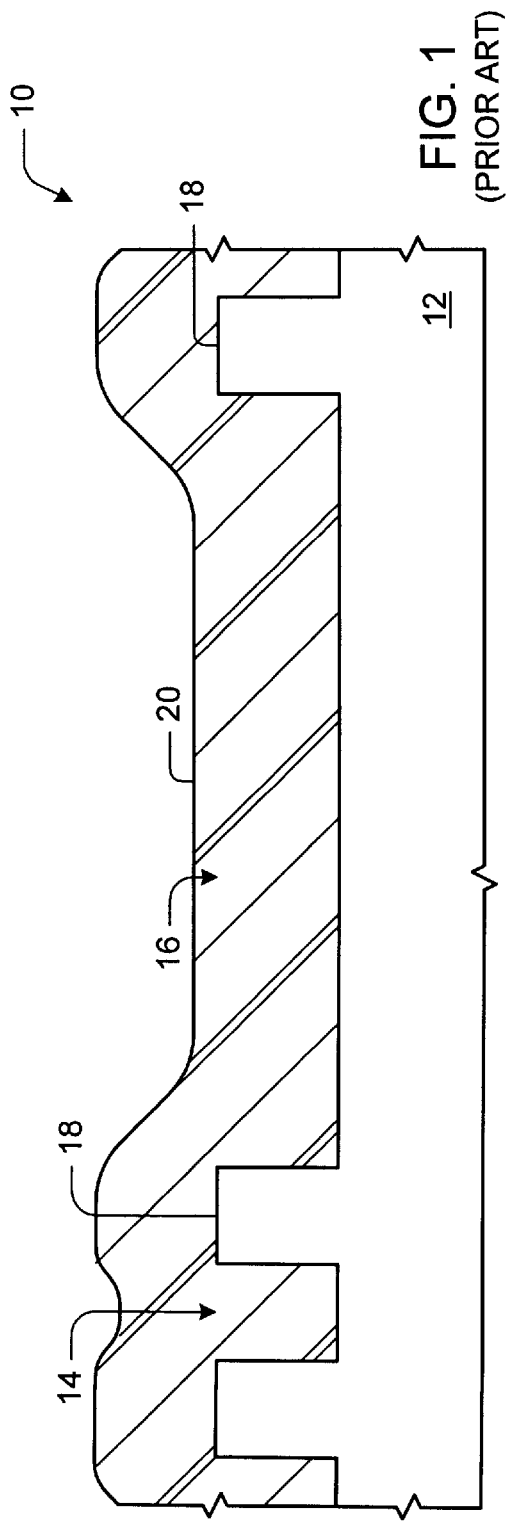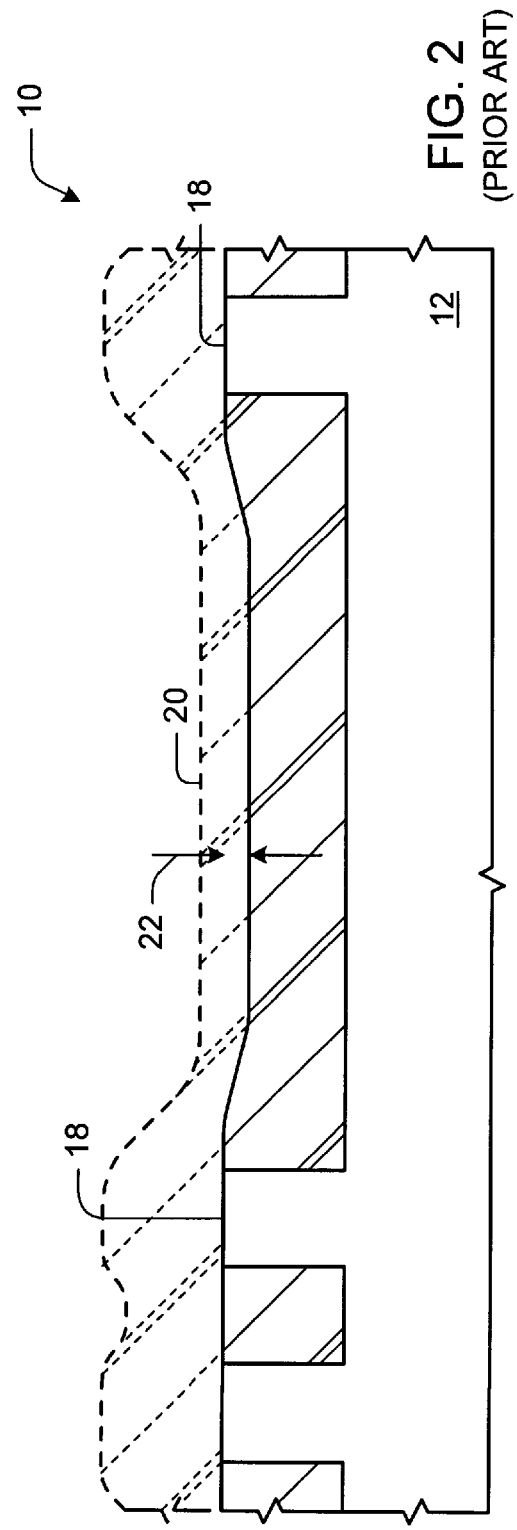

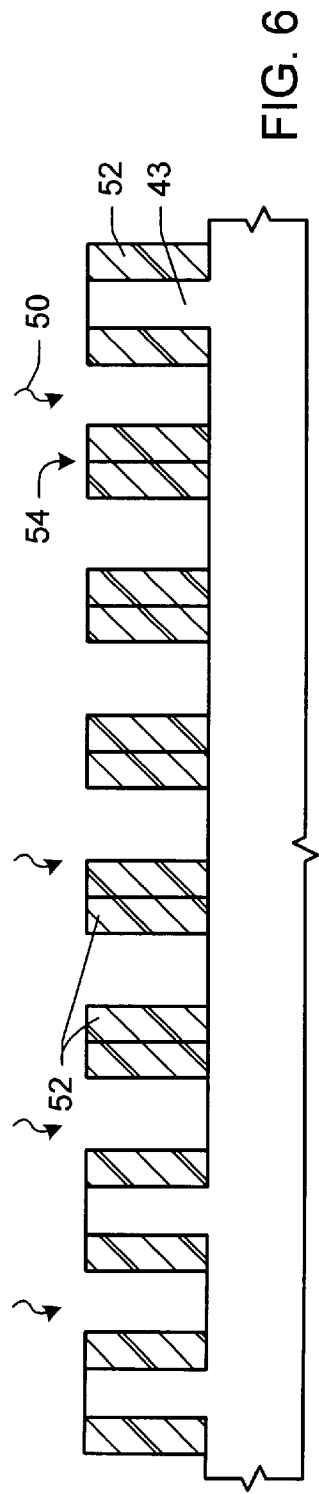
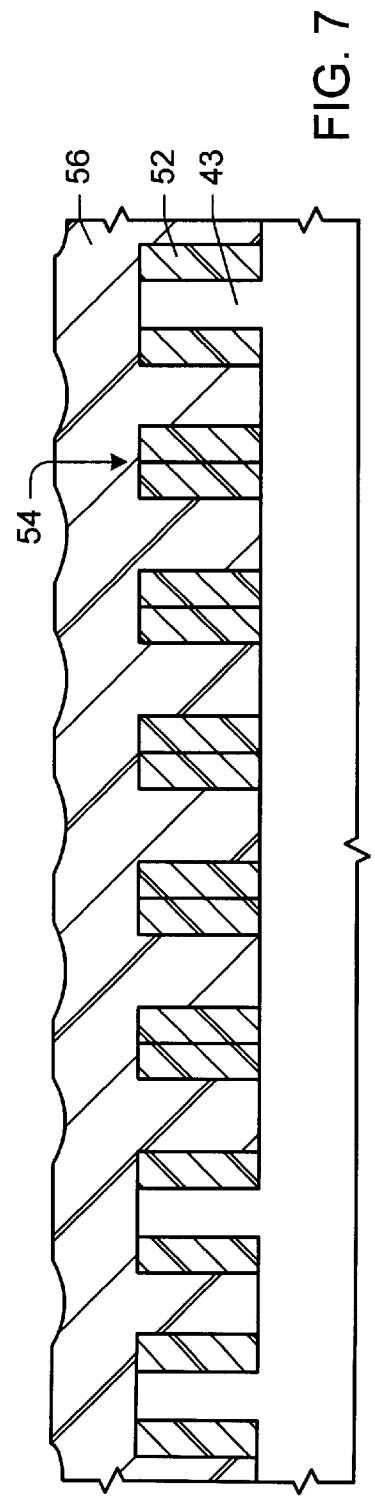
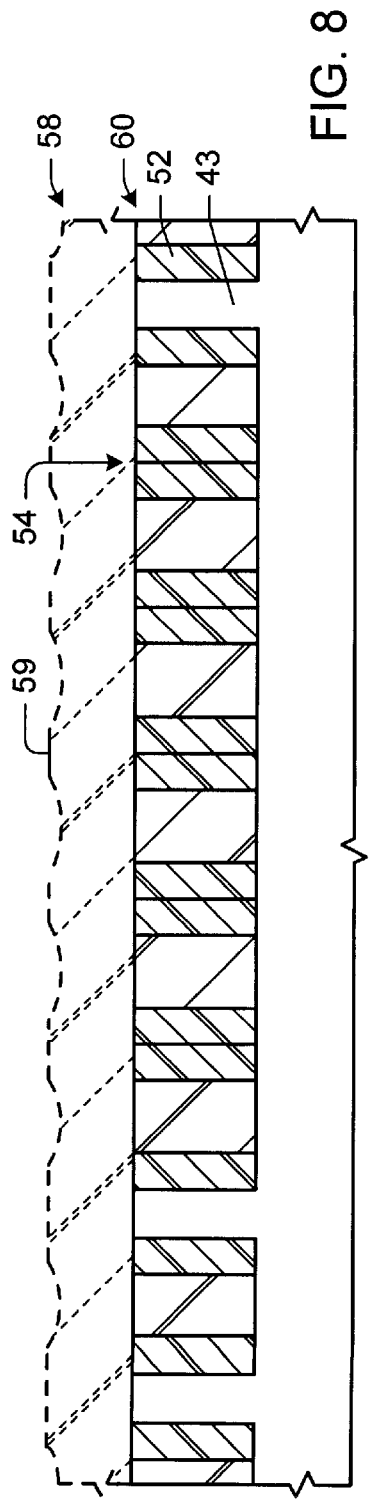

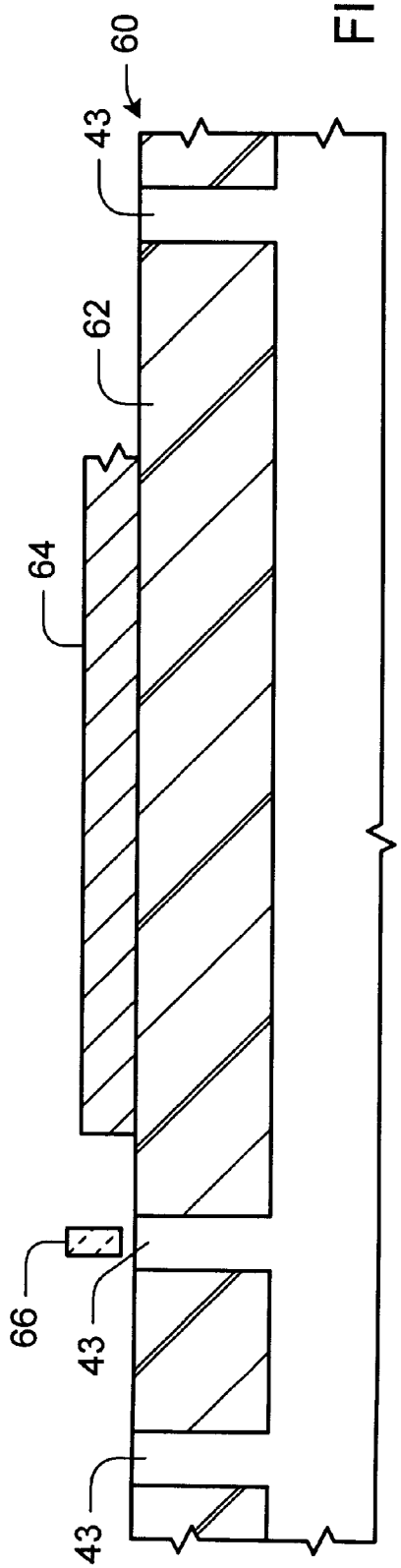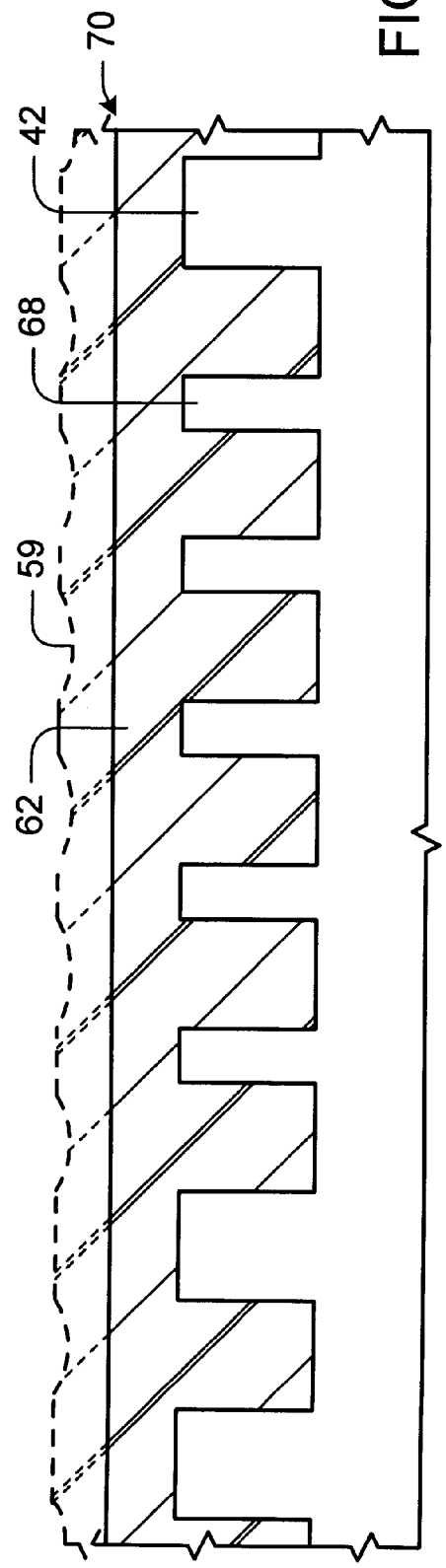

METHOD FOR ACHIEVING GLOBAL PLANARIZATION BY FORMING MINIMUM MESAS IN LARGE FIELD AREAS

This application is a continuation of application Ser. No. 08/633,620, filed Apr. 17, 1995, now abandoned.

BACKGROUND OF THE INVENTION

1. Field of the Invention

This invention relates to semiconductor fabrication and more particularly to an improved process of globally planarizing a field dielectric by placing minimum mesas (hereinafter "silicon risers") in large area isolation regions.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS process involves oxidizing field regions between devices. The oxide grown in field regions are termed field oxide, wherein field oxide is grown during the initial stages of integrated circuit fabrication, before source and drain implants are placed in device areas or active areas. By growing a thick field oxide in isolation (or field) regions pre-implanted with a channel-stop dopant, LOCOS processing serves to prevent the establishment of parasitic channels in the field regions.

While LOCOS has remained a popular isolation technology, there are several problems inherent with LOCOS. First, a growing field oxide extends laterally as a bird's-beak structure. In many instances, the bird's-beak structure can unacceptably encroach into the device active area. Second, the pre-implanted channel-stop dopant oftentimes redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". Despite advances made to decrease bird's-beak, channel-stop encroachment and non-planarity, it appears that LOCOS technology is still inadequate for deep submicron MOS technologies. The shallow trench process is better suited for isolating densely spaced active devices having field regions less than one micron in lateral dimension.

The trench process involves the steps of etching a silicon substrate surface to a relatively shallow depth, e.g., between 0.2 to 0.5 microns, and then refilling the shallow trench with a deposited dielectric. Some trench processes include an interim step of growing oxide on trench walls prior to the trench being filled with a deposited dielectric. After the trench is filled, it is then planarized to complete the isolation structure.

The trench process eliminates bird's-beak and channel-stop dopant redistribution problems. In addition, the isolation structure is fully recessed, offering at least a potential for a planar surface. Still further, field-oxide thinning in narrow isolation spaces does not occur and the threshold voltage is constant as a function of channel width.

While the trench isolation process has many advantages over LOCOS, it cannot in all instances achieve complete global planarization across the entire semiconductor topography. The upper surface of fill dielectric in large isolation areas are generally at lower elevational levels than the upper surface fill dielectric in small isolation areas. The fill dielectric readily deposits in small area trenches such that the elevation of the fill dielectric in a small area is greater than the elevation within a large area trench. Accordingly, subsequent processing is needed to bring the large area fill topography to the same elevational level as small area fill topography.

Most researchers have focused upon fairly complex processes for planarizing large and small area fill dielectrics. Those processes generally involve rework of the fill dielectric. A popular rework technique involves depositing a sacrificial layer across the fill dielectric topography, and then removing the sacrificial layer at the same etch rate as the underlying dielectric. Generally, the sacrificial layer is deposited as a low-viscosity liquid. Baking the liquid, or exposing it to ultraviolet light, causes the liquid to convert to solid form, as a solid-gel reaction. Popular sacrificial materials include photoresist, polymide or spin-on glass (SOG). The sacrificial layers generally etch back in a plasma until the topmost regions of the fill dielectric are exposed. The etch chemistry is then modified so that the sacrificial layer material and the underlying fill dielectric are etched at approximately the same rate. The etch is continued until all of the sacrificial layer has been etched away, leaving a somewhat planar dielectric upper surface.

The sacrificial etchback technique is generally valid only for the planarization of topographies in which features are less than 10 $\mu$m (microns) apart. For large regions between trenches, the step height will not be reduced, since the photoresist thickness on top of such features will be the same as the thickness over the adjacent trench.

In an effort to overcome the shortcomings of the etchback process, a planarization block mask may be used. In this procedure, a liquid material is applied and developed as a planarization film followed by a block mask used to expose and develop this film. The block mask protects topography in wide, low regions from a subsequent etch plasma. The upper surface of high regions can then be removed to an elevational level commensurate with the protected low regions. The planarization block mask involves an additional lithography step and a mask which is produced by selectively reversing the mask used in producing the underlying topography. Mask reversal may involve errors due to changes in the resist thickness caused by the underlying pattern, misalignment, etc.

In an effort to eliminate the complex deposition, patterning and etch processes involved with sacrificial deposition, etch back, and the block masking, many manufacturers have directed their attention to chemical-mechanical polishing (CMP). Application of a chemical slurry and an abrasive polishing pad across the entire semiconductor topography, allows planarization of that topography commensurate with the planarity of the pad surface. Unfortunately, however, when force is applied to a pad, the pad will oftentimes conform to the unevenness of that topography. Thus, while high elevation areas, or peaks, receive substantial polishing, low elevational areas (or valleys) are also abraded.

A better understanding of the problems inherent with CMP are illustrates in reference to FIGS. 1 and 2. FIG. 1 depicts a partial cross-section of a semiconductor topography 10. Topography 10 includes a substrate 12 which has been fashioned with a small area trench 14 and a large area trench 16 according to the trench isolation process. Trenches 14 and 16 define field areas between active regions, wherein active regions are defined as silicon mesas 18 which extend from an elevation equivalent to the trench base. Deposited upon and between mesas 18 is a fill dielectric 20.

FIG. 2 illustrates a processing step subsequent to that shown in FIG. 1. Specifically, the upper surface of fill dielectric material 20 receives CMP. The polishing pad inherently flexes or conforms under pressure to the upper surface of dielectric 20, causing the polishing pad to attack and remove dielectric 20 upper surface in large area trench 16, albeit to a lesser degree than the removal of dielectric 20 in small area trench 14. If dielectric in large area trench 16 is not sufficiently thick to withstand the attack, the dielectric upper surface will be removed below the desired planar elevation. CMP causes extensive erosion of isolated silicon mesas (i.e., the silicon surface). Thus, a slight recess of dielectric 20 upper surface occurs at the conclusion of CMP. That recess is shown as reference numeral 22.

A need therefore exists in producing a process which can planarize fill dielectric within large area trenches to an elevational level equal to that of fill dielectric within small area trenches. Large area trenches are those defined as having a width or length greater than 5 microns. The desired process must be simple to use. Accordingly, the desired process must not entail additional deposition, etch, and/or lithography steps attributable to the aforementioned etch-back and/or block masking processes. The desired process would preferably involve a fill dielectric conditioned with an upper topography which can be blanket planarized.

SUMMARY OF THE INVENTION

The problems outlined above are in large part solved by an improved shallow trench process of the present invention. The improved process hereof demonstrates substantially global planarization of fill dielectric in both large and small trench areas relative to silicon mesa upper surfaces arranged therebetween. The trench process is one which forms a substantially planar fill dielectric upper surface without involving additional deposition, etching or lithography steps. The improved process is readily incorporated into the standard shallow trench fabrication sequence.

The present process involves forming silicon risers in large area trenches. The silicon risers are spaced from each other similar to spacings (preferably minimum spacings) between silicon mesas. Accordingly, large area trenches are broken up into small area trenches using silicon risers. Unlike silicon mesas formed in active regions, silicon risers are formed exclusively in field regions. The silicon risers are designed to extend completely across large area trenches, and break large area trenches into smaller area trenches of optimal fill width. By maintaining an optimal fill dimension (or width), the fill characteristic of dielectric placed within silicon risers is equal to the fill characteristic of fill dielectric placed between closely spaced silicon mesas.

The silicon risers can either be maintained as upward protruding silicon regions or, in an alternative embodiment, be converted to an oxide. The oxide is formed during oxidation of silicon mesa sidewalls prior to deposition of fill dielectric. Conversion to an oxide ensures the entire large area trench is composed of an insulative material. The insulative material thickness forms wide separation between overlying conductors and the silicon substrate. Accordingly, line-to-substrate capacitance is minimized. Silicon risers need not be converted, however, in instances where the fill dielectric extends well above the upper surfaces of those risers. In the latter instance, the fill dielectric geometry and/or electrical characteristics of the dielectric suffices to ensure minimal line-to-substrate capacitance.

Broadly speaking, the present invention contemplates a method for planarizing a field dielectric between a widely spaced pair of active regions. The method includes the steps of providing a spaced pair of active regions within a silicon substrate. Intermittent regions of the silicon substrate are then removed between the pair of active regions to form a spaced set of silicon risers extending from the silicon substrate. A field dielectric is then deposited upon and between the silicon risers to produce a field dielectric topography having recesses between respective silicon risers. The field dielectric topography is then removed to an elevational level below the recesses and above the silicon risers.

According to one embodiment, a chemical mechanical polishing step is used to remove the field dielectric topography. The active regions comprise silicon mesas having an upper surface approximately equal to an upper surface of the silicon risers. Preferably, the pair of active regions are spaced more than 5.0 microns apart. Thus, the spacing between widely spaced active regions is defined to exceed 5.0 microns.

The present invention further contemplates a method for planarizing a field dielectric between a pair of active regions. Silicon risers are formed between a pair of silicon mesas which form the active regions. The silicon mesas and the silicon risers extend from a silicon substrate with trenches formed therebetween. The silicon risers are then converted to a grown dielectric. A field dielectric is then deposited upon and between the grown dielectric to produce a dielectric topography having recesses in registry above respective trenches. The dielectric topography is then removed to an elevational level below the recesses, substantially equal to the upper surfaces of the silicon risers and silicon mesas.

Preferably, the trenches each comprise a width of uniform dimension. Accordingly, the silicon risers are used to break up large area trenches or isolation areas into smaller area trenches. The large area trenches exist between widely spaced active regions. According to one embodiment, the silicon risers each comprise a width of equal dimensions, wherein the converting step comprises exposing sidewalls of silicon mesas and silicon risers to an oxidizing agent, and wherein the equal width silicon risers are consumed in a lateral direction. The silicon risers, in whatever form, extend intermittently across the entire field region and serve to form smaller width trenches of substantially uniform geometry and density.

BRIEF DESCRIPTION OF THE DRAWINGS

Other objects and advantages of the invention will become apparent upon reading the following detailed description and upon reference to the accompanying drawings in which:

FIG. 1 is a partial cross-sectional view of a semiconductor topography with fill dielectric placed upon and between silicon mesas formed according to a conventional shallow trench process;

FIG. 2 is a processing step subsequent to that of FIG. 1, wherein the upper topography of fill dielectric is removed to uneven planarization levels according to a conventional CMP process;

FIG. 6 is a processing step subsequent to FIG. 5, wherein silicon mesas are consumed by a grown dielectric according to one embodiment;

FIG. 7 is a processing step subsequent to FIG. 6, wherein a fill dielectric is deposited upon and between silicon mesas and silicon risers;

FIG. 8 is a processing step subsequent to FIG. 7, wherein the upper topography of the fill dielectric is removed to a level substantially equal to the upper surface of the silicon risers and silicon mesas;

FIG. 9 is a processing step subsequent to FIG. 8, wherein a conductive layer is formed upon the fill dielectric in field regions illustrative of separation between silicon substrate and an overlying conductor; and FIG. 10 is a processing step subsequent to FIG. 5, wherein silicon mesas are not consumed and fill dielectric is removed only in upper topological regions, according to another embodiment.

Figure 3:
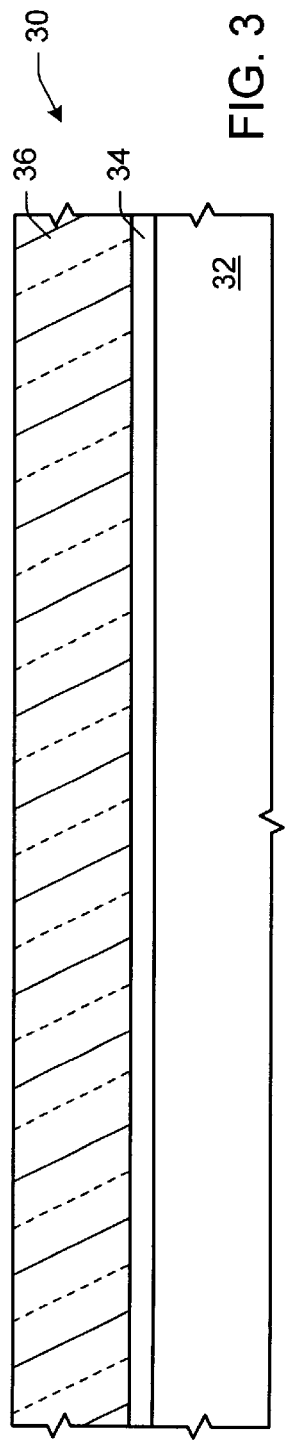
FIG. 3 is a partial cross-sectional view of a semiconductor topography with photoresist applied across the topography according to an exemplary embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to drawings, FIG. 3 is a partial cross-sectional view of a semiconductor topography 30. Topography 30 includes a substrate 32, upon which a protective layer 34 is formed. Deposited across the entire protective layer is a photoresist layer 36. Substrate 30 preferably comprises single crystal silicon, protective layer 34 comprises any layer which protects the silicon surface from etch materials and/or oxidation, and photoresist 36 includes any material which can selectively polymerize when exposed to ultraviolet light. Topography 30 can include any topography from which an integrated circuit is fashioned. For example, metal oxide semiconductor (MOS) might be one of many types of circuits which can be formed from semiconductor topography 30.

Figure 4:
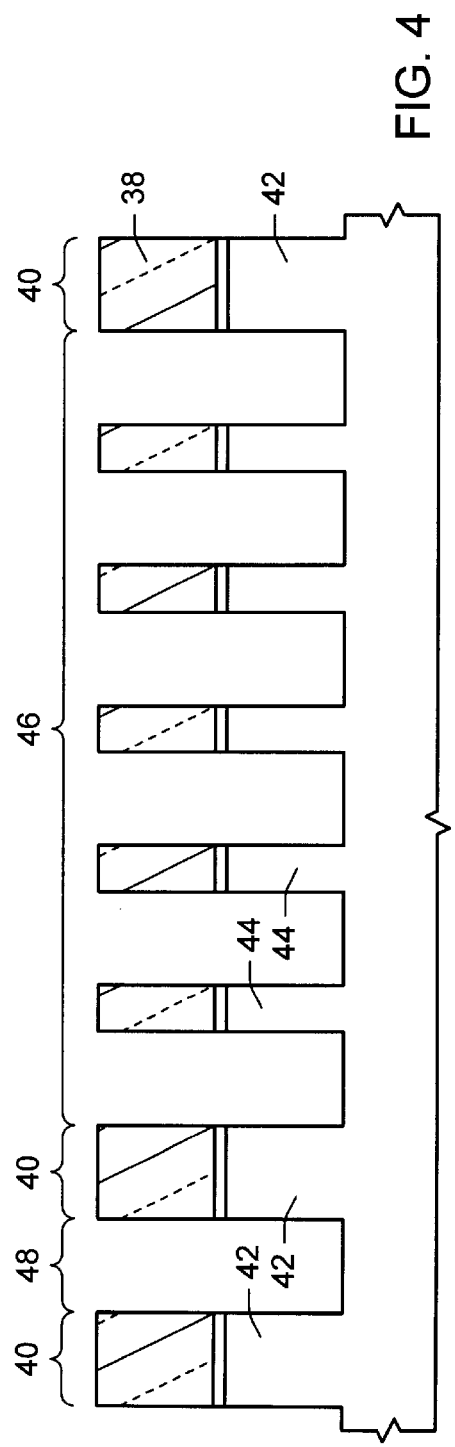
FIG. 4 is a processing step subsequent to FIG. 3, wherein the photoresist is patterned and intermittent regions of silicon substrate are removed to form silicon mesas separated by silicon risers in large isolation areas.

FIG. 4 illustrates a processing step subsequent to FIG. 3. Specifically, a pattern is printed upon photoresist 36, and select regions are exposed and developed. The polymerized regions of photoresist 36 are represented as reference numerals 38. Polymerized photoresist 38 protects the underlying material from etchant. The etchant material is chosen to remove areas not protected by photoresist 38. Some of the areas protected by photoresist 38 include active regions 40. Active regions 40 represent areas where transistors will be formed, and are generally designated in areas exclusive of field regions 46.

The patterned photoresist allows etchant to remove between, e.g., 0.2 to 1.0 microns of substrate material 32. The removed regions are designated as trench regions, and the non-removed regions are designated as either silicon mesas 42 or silicon risers 44. Silicon mesas exist only in active regions 40, while silicon risers exist only in field regions 46. Silicon risers 44 are spaced between trenches, and extend in one direction entirely across field region 46. Silicon risers 44 expressly do not receive active transistors, including source/drain implants, gate oxide, and polysilicon gate material normally associated with active transistors. Silicon risers 44 are dimensioned such that trenches between silicon risers are of substantially the same width as trenches between closely spaced active areas 40. Accordingly, silicon risers 44 extend in one direction entirely across field regions, parallel to each other, a distance spaced by minimum active area spacing.

Large area field region 46 is defined as an area in which active regions 40 on opposing sides of that area are spaced more than 5.0 microns apart. Small area field region 48 is generally defined as one between active areas spaced between 0.1 to 2.0 microns apart. Accordingly, the trench spacings between silicon risers 44 substantially match the width of small field region 48, where small field region 48 is defined as the minimum spacing between active regions.

Figure 5:
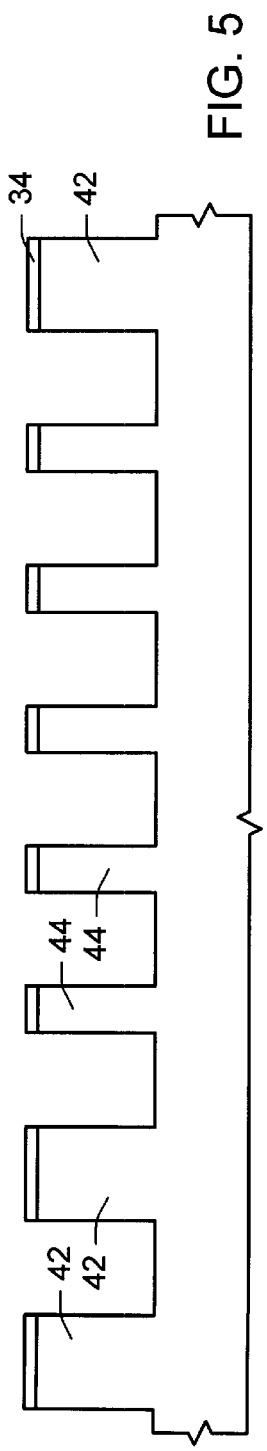
FIG. 5 is a processing step subsequent to that of FIG. 4, wherein photoresist, or photoresist and underlying protectant layer, is removed from the silicon mesas and silicon risers.

Referring to FIG. 5, a processing step subsequent to FIG. 4 is shown. FIG. 5 illustrates removal of patterned photoresist 38 from silicon risers 44 and silicon mesas at 42. Protective layer 34 may be either removed or maintained depending upon whether the upper surface integrity of mesas and risers need be maintained during subsequent processing operations. Merely as an example, FIG. 5 illustrates maintenance of layer 34, wherein layer 34 prevents oxidation at the upper surfaces of silicon mesas 42 and silicon risers 44.

Turning now to FIG. 6, silicon risers 44 and silicon mesas 42 of FIG. 5 are exposed to an oxidizing agent, such as dry oxygen or oxidizing vapor 50 to form consumed silicon risers 54 and partially consumed silicon mesas 43. The oxidizing ambient causes a dielectric 52 to grow upon and within sidewalls of the risers and mesas. Typically, for an oxide thickness of t, 0.45t of silicon will be consumed, and the oxide surface will rise approximately 0.55t above the original silicon surface. As an example, if silicon riser width is 900 angstroms, then for the entire riser to be converted to oxide, approximately 450 angstroms must be consumed on each sidewall, leaving the consumed riser thickness (or oxide thickness) to be approximately 2×1000 angstroms or 2000 angstroms. Since silicon mesas 42 are wider than silicon risers, grown oxide 52 will not consume the entire width of the mesas. Instead, grown oxide 52 will exist at a width of approximately 1000 angstroms on each sidewall, for the example given above. It is understood that silicon riser width can vary, and the amount of grown oxide 52 can also vary depending upon pattern dimensions within the mask used to form the risers and upon the ambient conditions and oxidizing exposure time. Accordingly, the above exemplary width can be varied depending upon the desired application.

Turning now to FIG. 7, a processing step is shown whereby a fill dielectric 56 is deposited upon and between the converted silicon risers 54 and partially consumed silicon mesas 43. Fill dielectric 56 is preferably an LPCVD-deposited TEOS or an atmospheric-pressure ozone-TEOS material blanket deposited across the entire wafer topography. It is understood that fill dielectric 56 may comprise several applications of dielectric material (preferably oxide) in order to fill trenches between consumed silicon risers 54 and mesas 43.

FIG. 8 illustrates a planarization step which occurs subsequent to the step shown in FIG. 7. More specifically, fill dielectric 56 is partially removed at its upper regions from an elevational level 58 to an elevational level 60. Elevational level 60 resides below recesses 59, and is substantially level across converted silicon risers 54 and mesas 43. Planarization is performed using chemical-mechanical polishing (CMP). CMP is effective in producing a substantially planar surface since recesses 59 are minimal as a result of the close spacing between silicon risers 54. Accordingly, silicon risers 54 in wide field areas ensure that the deposited topography of fill dielectric has many small recesses, rather than one large recess. A large recess is problematic in CMP since a large recess can not in all instances be removed, or planarized. Recess 59 preferably comprises a lateral dimension substantially equal to the width of an underlying trench. The vertical dimension of recess 59 is also proportional to the width of the trench, wherein trench width is, according to a preferred embodiment, of uniform dimension across the semiconductor substrate. By ensuring that spacings between silicon riser 54 is of approximately the same width, the present process can control the recess dimension and thereby achieve substantial planarity through CMP.

FIG. 9 illustrates a processing step subsequent to that of FIG. 8. Shown as a unitary dielectric material, comprising fill dielectric and grown dielectric, a field dielectric 62 is shown. Field dielectric is formed as a result of complete consumption of silicon risers 54, and the deposition of fill dielectric 56 between the consumed risers. Field dielectric 62 is dimensioned having a width extending between silicon mesas 43 (between active regions). Field dielectric 62 also has a thickness extending from the bottom of silicon trenches formed in the step shown in FIG. 4 to the elevation 60 shown in FIG. 8. Deposited and subsequently patterned upon field dielectric 62 is a conductor 64. Conductor 64 is electrically conductive, and can be made of either a refractory metal or polysilicon. Conductor 64 may also be formed above partially consumed active regions 43, and thereby forms a gate conductor 66. Gate conductor 66 and field conductor 64 can be formed from the same conductive layer, possibly as the first level of interconnect within numerous levels of interconnect. Conductor 64 is used to connect isolated devices found within active regions 43.

FIG. 10 illustrates, according to an alternative embodiment, silicon risers 68. Silicon risers 68 are not consumed by an oxidizing ambient, as in the embodiment shown in FIG. 6. Instead, silicon risers 68, as well as silicon mesas 42 extend upward into the fill dielectric 62. Fill dielectric 62 is subsequently planarized by removing recesses 59, similar to the step shown in FIG. 8. A distinction, however, between the steps of FIG. 8 and FIG. 10 is the amount by which fill dielectric 62 upper surface is removed, or planarized. In FIG. 10, CMP occurs to an elevational depth below recesses 59 but well above the upper surfaces of silicon mesas 42 and silicon risers 68. The planarization level 70 is chosen such that sufficient dielectric thickness exist between the silicon upper surfaces and any overlying conductors, such as a conductor placed upon the planarized surface 70.

It will be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method, as part of a MOS trench isolation process, for planarizing a field dielectric between a widely spaced pair of active regions, comprising:

providing a spaced pair of active regions within a silicon substrate;

forming a protective layer upon said silicon substrate;

depositing a photoresist upon said protective layer;

polymerizing select areas of said photoresist layer;

removing intermittent regions of said photoresist layer, said protective layer, and said silicon substrate between said pair of active regions to form a spaced set of silicon risers extending from said silicon substrate, wherein said spaced set of silicon risers is defined by said select areas of said photoresist layer, and wherein said silicon risers comprise portions of said silicon substrate that have not previously been subjected to an implantation process associated with active devices;

removing remaining portions of said photoresist layer, wherein said remaining protective layer prevents grown oxidation on top surfaces of said active regions and said spaced set of silicon risers;

depositing a field dielectric upon and between said silicon risers to produce a field dielectric topography having recesses between respective silicon risers;

removing said field dielectric topography to an elevational level below said recesses and above said silicon risers; and forming at least one MOS device in each of said pair of active regions.

2. The method as recited in claim 1, wherein the step of removing said intermittent regions comprises etching 0.2 to 1.0 microns of said silicon substrate within said intermittent regions.

3. The method as recited in claim 1, wherein said depositing step comprises chemical vapor depositing from a tetraethoxysilane source.

4. The method as recited in claim 1, wherein said depositing step comprises chemical vapor depositing from a tetraethoxysilane and ozone source.

5. The method as recited in claim 1, wherein said depositing step comprises depositing said field dielectric from within a low pressure chemical vapor deposition chamber.

6. The method as recited in claim 1, wherein said removing said field dielectric topography comprises chemical mechanical polishing.

7. The method as recited in claim 1, wherein said active regions comprise silicon mesas having an upper surface substantially equal to an upper surface of said silicon risers.

8. The method as recited in claim 1, wherein said pair of active regions are spaced more than 5.0 microns apart.

9. A method in a MOS trench isolation process for planarizing a field dielectric between a pair of active regions, comprising:

providing a spaced pair of active regions within a silicon substrate;

forming a protective layer upon said silicon substrate;

depositing a photoresist upon said protective layer;

polymerizing select areas of said photoresist layer;

removing intermittent regions of said photoresist layer, said protective layer, and said silicon substrate between said pair of active regions to form a set of silicon risers spaced from each other between a pair of silicon mesas which are aligned with said active region, said silicon mesas and said silicon risers extend from said silicon substrate with trenches formed therebetween, wherein said spaced set of silicon risers is defined by said select areas of said photoresist layer, and wherein said silicon risers comprise portions of said silicon substrate that have not previously been subjected to an implantation process associated with active devices;

removing remaining portions of said photoresist layer;

converting said silicon risers to a grown dielectric;

depositing a field dielectric upon and between said grown dielectric to produce a dielectric topography having recesses in registry above respective said trenches;

removing said dielectric topography to an elevational level below said recesses and substantially equal to the upper surfaces of said grown dielectric and said silicon mesas; and forming at least one MOS device in each of said pair of active regions.

10. The method as recited in claim 9, wherein said recesses comprise a lateral dimension substantially equal to a width of said trenches.

11. The method as recited in claim 9, wherein a vertical dimension of said recesses is proportional to a width of said trenches.

12. The method as recited in claim 9, wherein said trenches each comprise a width of uniform dimension.

13. The method as recited in claim 9, wherein said silicon risers each comprise a width of equal dimension.

14. The method as recited in claim 9, wherein said converting step comprises exposing sidewalls of said silicon mesas and silicon risers to an oxidizing agent, wherein said silicon risers are consumed in a lateral direction as silicon dioxide.

15. The method as recited in claim 9, wherein said depositing step comprises chemical vapor depositing from a tetraethoxysilane source.

16. The method as recited in claim 9, wherein said depositing step comprises chemical vapor depositing from a tetraethoxysilane and ozone source.

17. The method as recited in claim 9, wherein said depositing step comprises depositing said field dielectric from within a low pressure chemical vapor deposition chamber.

18. The method as recited in claim 9, wherein said depositing step comprises depositing said field dielectric from a silane and oxygen source with or without plasma.

19. The method as recited in claim 9, wherein said removing said field dielectric topography comprises chemical mechanical polishing.

20. The method as recited in claim 9, wherein said removing said field dielectric topography comprises etching said field dielectric.

21. The method as recited in claim 9, wherein said pair of active regions are spaced more than 5.0 microns apart.

22. A method, as part of a MOS trench-isolation process, for planarizing a field dielectric between a widely spaced pair of active regions, comprising:

providing a spaced pair of active regions within a silicon substrate;

removing intermittent regions of said silicon substrate between said pair of active regions to form a spaced set of silicon risers extending from said silicon substrate, wherein said silicon risers comprise portions of said silicon substrate that have not previously been subjected to an implantation process associated with active devices;

depositing a field dielectric upon and between said silicon risers to produce a field dielectric topography having recesses between respective silicon risers;

removing said field dielectric topography to an elevational level at or below the bottom of said recesses and at or above said silicon risers; and forming at least one MOS device in each of said pair of active regions.

23. The method as recited in claim 22, further comprising converting said silicon risers to a grown dielectric.

24. The method as recited in claim 22, wherein said removing said field dielectric topography comprises chemical-mechanical polishing.

25. The method as recited in claim 22, wherein said silicon risers are spaced at the minimum process spacing.

26. The method as recited in claim 22, further comprising:

forming a protective layer upon said silicon substrate;

depositing a photoresist upon said protective layer;

polymerizing select areas of said photoresist layer; and wherein said removing intermittent regions further comprises removing intermittent regions of said photoresist layer and said protective layer, wherein said spaced set of silicon risers is defined by said select areas of said photoresist layer.

* * * * *

UNITED STATES PATENT AND TRADEMARK OFFICE

CERTIFICATE OF CORRECTION

PATENT NO.: 5,926,713

DATED: July 20, 1999

INVENTOR(S): Hause et al.

It is certified that error appears in the above-identified patent and that said Letters Patent is hereby corrected as shown below:

On the Title Page:

Item [63] after the phrase "Continuation of application No. 08/633,620," please delete April 17, 1995 and substitute therefor --April 17, 1996--.

Signed and Sealed this

Fourteenth Day of December, 1999

Attest:

Q. TODD DICKINSON

*Attesting Officer*        *Acting Commissioner of Patents and Trademarks*